United States Patent [19]

Nonaka

[11] Patent Number: 4,696,712

[45] Date of Patent: Sep. 29, 1987

[54] SEMICONDUCTOR WAFER MOUNTING AND CUTTING SYSTEM

[75] Inventor: Yuzo Nonaka, Chiba, Japan

[73] Assignee: Disco Abrasive Systems, Ltd., Tokyo, Japan

[21] Appl. No.: 791,488

[22] Filed: Oct. 25, 1985

Related U.S. Application Data

[63] Continuation-in-part of Ser. No. 646,326, Aug. 31, 1984, abandoned.

[30] Foreign Application Priority Data

Nov. 7, 1983 [JP]  Japan ................................. 58-207496

[51] Int. Cl.$^4$ ............................................. B32B 31/18
[52] U.S. Cl. ........................................ 156/351; 156/64; 156/257; 156/353; 156/523; 225/93; 437/8; 437/209
[58] Field of Search ................... 29/574, 583; 156/64, 156/257, 351, 353, 523; 225/93

[56] References Cited

U.S. PATENT DOCUMENTS

| | | | |
|---|---|---|---|
| 3,811,182 | 5/1974 | Ryan et al. | 29/574 |
| 4,296,542 | 10/1981 | Gotman | 29/574 |
| 4,485,553 | 12/1984 | Christian et al. | 29/583 X |

*Primary Examiner*—Robert A. Dawson
*Attorney, Agent, or Firm*—Beveridge, DeGrandi & Weilacher

[57] ABSTRACT

A semiconductor wafer mounting and cutting system including a wafer mounting machine for mounting a semiconductor wafer to a frame and a wafer cutting machine for receiving the frame and the wafer mounted thereto fed from the wafer mounting machine and cutting the wafer as required. The system further includes a controlling device for forming a relative relation signal showing a relative relation between a first indication which has been or is applied to the frame and a second indication of the wafer, which wafer has been or is mounted to the frame, and memory means for memorizing the relative relation signal formed by the controlling device.

10 Claims, 5 Drawing Figures

SEMICONDUCTOR WAFER MOUNTING AND CUTTING SYSTEM

CROSS-REFERENCE TO RELATED APPLICATION

This application is a continuation-in-part application of my application Ser. No. 646,326, filed on 8/31/84, which is now abandoned.

FIELD OF THE INVENTION

This invention relates to a semiconductor wafer mounting and cutting system for mounting a semiconductor wafer to a frame and cutting the wafer mounted to the frame as required.

DESCRIPTION OF THE PRIOR ART

As is well known, in the production of semiconductor devices, a number of circuit patterns are applied to the surface of a semiconductor wafer. These circuit patterns are generally applied to a number of rectangular areas defined by a number of straight-line areas (which are generally called streets) arranged in a lattice pattern. Then, a so-called probing process is carried out to examine whether or not each of the circuit patterns is as required. Thereafter, a cutting process is carried out to cut the wafer along the straight-line areas to separate the individual rectangular areas. (The individually separated rectangular areas are generally called chips.) Furthermore, a process such as a so-called die bonding is carried out to fix the individually separated rectangular areas to lead frames or packages.

In the aforesaid cutting process, the wafer is generally mounted to a frame prior to the cutting of the wafer. This frame usually has an opening having a larger area than the wafer. The wafer is mounted to the frame by positioning the wafer within this opening and applying tape over the frame and the wafer to the backs of the both. Thereafter, the wafer is cut along the straight-line areas. This cutting cuts only the wafer without cutting the tape. Therefore, the wafer is separated into the individual rectangular areas, but the individual rectangular areas are not separately scattered and are held by the tape at the positions before the cutting.

In the above-described production processes of semiconductor devices, it is important to accurately recognize the characteristics of a wafer which is to be actually treated in each process and to control each process. For example, in the cutting of a wafer in the aforesaid cutting process, it is important to accurately recognize characteristics such as the dimensions of the wafer itself and the dimensions of the circuit pattern (accordingly the intervals of the straight-line areas). In the aforesaid die bonding process, it is generally important to accurately recognize the kind of the circuit pattern (and also the results in the aforesaid probing process) in addition to the above-described characteristics.

In view of the above, as is well known among those skilled in the art, in addition to the aforesaid circuit patterns, an indication which may be a numeral showing, for example, a manufacturing number in a certain factory is generally applied to the surface of the wafer. In addition, information relating to various characteristics of the wafer (for example, the characteristics of the material and dimensions of the wafer itself and the characteristics of the applied circuit patterns) is stored or memorized with the indication in suitable memory means. Therefore, if the indication applied to the surface of the wafer can be appropriately detected, necessary characteristics of the wafer can be recognized by searching for the information memorized in the memory means.

With respect to the detection of the indication, however, the following should be noted. The indication is relatively densely applied to a relatively small specific portion of the wafer in order to minimize the waste portion of the wafer. Since the specific portion to which the indication is applied is also cut and separated into two or more sections in the above-described cutting of the wafer, it becomes impossible or extremely difficult to appropriately detect the indication after cutting the wafer. Accordingly, it is impossible or extremely difficult to accurately recognize the characteristics of the wafer after the cutting process, and thus automation, increase of efficiency and the like in semiconductor device production is inhibited.

SUMMARY OF THE INVENTION

It is a primary object of this invention to make it possible to easily and accurately recognize the characteristics of the wafer even after the cutting of the wafer and thus to make it possible to realize automation, increase efficiency and the like in semiconductor device production.

The present inventor has found, as a result of his extensive study, that it is possible to achieve the primary object if, in a semiconductor wafer mounting and cutting system used in the cutting process of a wafer for mounting the wafer to a frame and then cutting the wafer mounted to the frame as required, a relative relation between a discriminating indication or first indication means which has been or is applied to the frame and an indication or second indication means of the wafer which has been or is mounted to the frame is established and this mutual relation is memorized. It possible thereafter to easily and accurately recognize the characteristics of the wafer by detecting the discriminating indication a first indication means of the frame.

According to this invention, there is provided a semiconductor wafer mounting and cutting system including a wafer mounting machine for mounting a semiconductor wafer to a frame and a wafer cutting machine for receiving the frame and the wafer mounted thereto fed from said wafer mounting machine and cutting the wafer as required. The system further comprises controlling means or relative relation signal forming means for forming a relative relation signal showing a relative relation between a first indication means which has been or is applied to the frame and a second indication means of the wafer which wafer has been or is mounted to the frame, and memory means for memorizing the relative relation signal formed by a controlling means.

The first discrimination means or discriminating indication of the frame may be applied to the frame before or after mounting the wafer to the frame if desired, but conveniently, it is applied to the frame in advance. Conveniently, the system still further comprises a wafer detecting means for detecting an indication or second indication means of the wafer to form a wafer signal corresponding thereto before the water is cut by the wafer cutting machine and a frame detecting means for detecting the first indication means of the frame to form a frame signal corresponding thereto, and the system is constructed so that the relative relation signal forming means forms the relative relation signal on the basis of the wafer signal and the frame signal.

DETAILED DESCRIPTION OF PREFERRED EMBODIMENTS

Now, referring to the accompanying drawings, one embodiment of the semiconductor wafer mounting and cutting system constructed in accordance with this invention will be described in detail.

Figure 1:
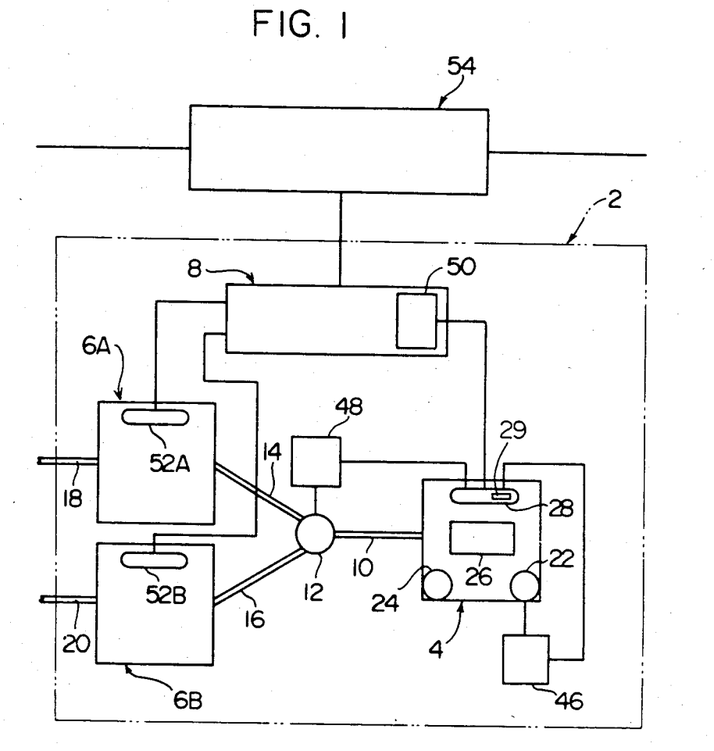
FIG. 1 is a simplified view schematically showing one embodiment of the semiconductor wafer mounting and cutting system constructed in accordance with this invention.

With reference to FIG. 1, the illustrated semiconductor wafer mounting and cutting system constructed in accordance with this invention shown generally at 2 includes one wafer mounting machine 4, two wafer cutting machines 6A, 6B and a system controlling means 8. The wafer mounting machine 4 mounts a semiconductor wafer to a frame to be described in detail hereinafter. The frame and the wafer mounted thereto are conveyed from the wafer mounting machine 4 to a junction 12 by a conveying means 10 and further conveyed to the wafer cutting machine 6A by a conveying means 14 or to the wafer cutting machine 6B by a conveying means 16. Each of the wafer cutting machines 6A and 6B cuts the wafer as required to be described in detail hereinafter. The frame and the wafer mounted thereto are further conveyed out of the wafer cutting machines 6A and 6B by conveying means 18 and 20 respectively and sent to a suitable wafer collecting station (not shown) or a processing means (not shown) for applying the next required treatment (for example, die bonding) to the wafer. The system controlling means 8 which may be constructed of a microprocessor mutually relates as required the operations of the wafer mounting machine 4 to the operations of the wafer cutting machines 6A and 6B and controls as required the operations of the conveying means 10, 14, 16, 18 and 20.

Figure 2:
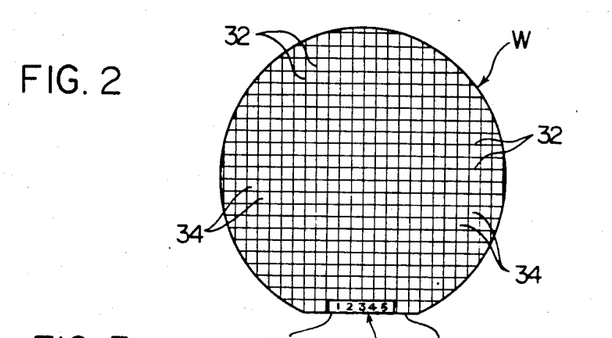
FIG. 2 is a top plan view showing a semiconductor wafer.
Figure 3:
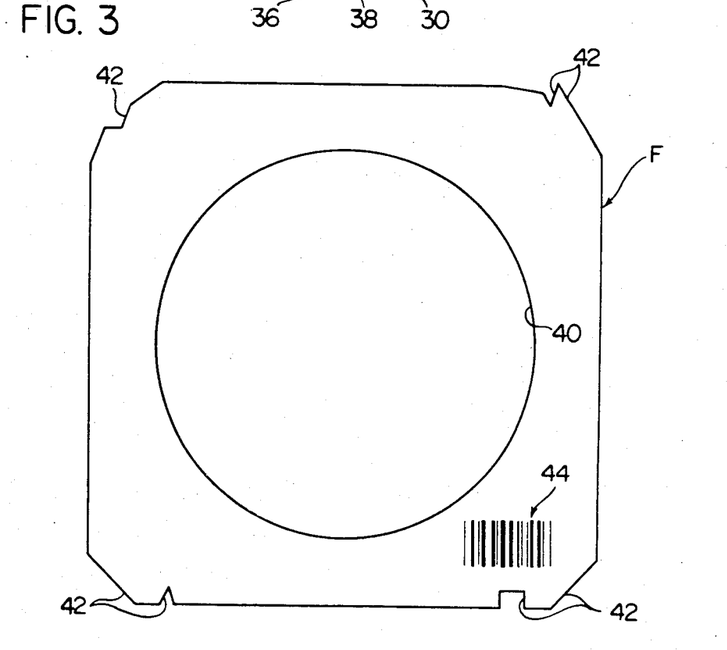
FIG. 3 is a top plan view showing a frame.
Figure 4:
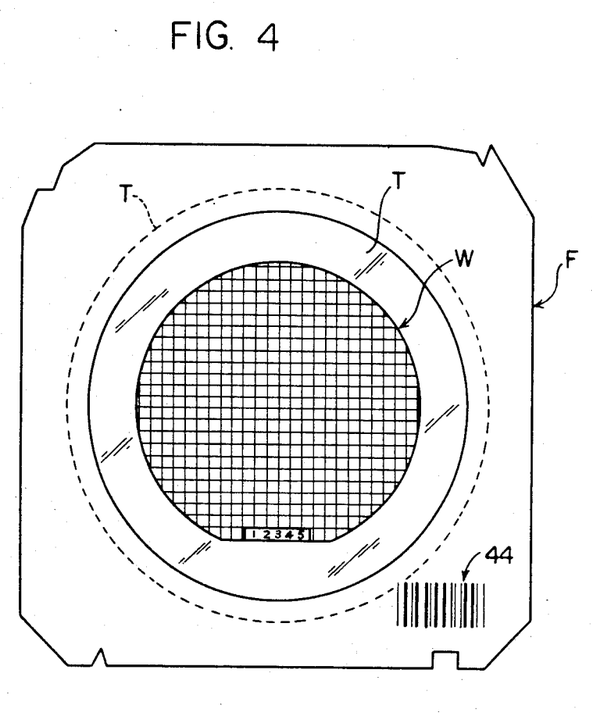
FIG. 4 is a top plan view showing the semiconductor wafer of FIG. 2 as mounted to the frame of FIG. 3 using tape.

The illustrated wafer mounting machine 4 is provided with a wafer station 22, a frame station 24 and a mounting operation station 26. In the wafer station 22 there are a plurality of wafers loaded automatically or manually, and in the frame station 24 there are a plurality of frames loaded automatically or manually. The wafer mounting machine 4 is also provided with a controlling means 28 which may be constructed of a microprocessor and the operations of the wafer mounting machine 4 itself are is controlled by this controlling means 28. In this wafer mounting machine 4, one frame is successively fed from the frame station 24 to the mounting operation station 26, and in correspondence with this, one wafer is successively fed from the wafer station 22 to the mounting operation station 26 where the wafer is mounted to the frame as required. FIG. 2 shows a wafer W which is fed from the wafer station 22 to the mounting operation station 26. There are a number of straight-line areas (streets) 32 arranged in a lattice pattern on the surface of the wafer W which is substantially disc-shaped except for a straight-line edge portion 30 generally called an orientation flat, and a number of rectangular areas 34 are defined by these number of straight-line areas 32. A required circuit pattern is applied to each of of rectangular areas 34. In addition, in the illustrated wafer W, there is a relatively small indication area 36 adjacent to the straight-line edge portion 30, and an indication 38 is applied onto this indication or indication means area 36. The indication or indication means 38 may, for example, be a numeral (such as "12345") showing a manufacturing number in a certain factory. With respect to this indication means 38, information mutually relating means 38 to various characteristics of the wafer W (for example, the characteristics of the material and the dimensions of the wafer itself and the characteristics of the applied circuit patterns) applied the indication 38 has already been memorized in a host computer 54 for (FIG. 1) managing and controlling for whole semiconductor device production process including the semiconductor wafer mounting and cutting processes. On the other hand, FIG. 3 shows one example of a frame F which is fed from the frame station 24 to the mounting operation station 26. The illustrated frame F is constructed of a plate having an approximately square external shape. A circular opening 40 having a larger area than the aforesaid wafer W is formed in the central portion of this frame F. Various notches 42 which can be used for conveying and positioning the frame F are formed at the periphery of the frame F. As shown in FIG. 4, in the mounting operation station 26 of the wafer mounting machine 4, the wafer W is positioned within the opening 40 of the frame F. Tape T is applied to the backs of the frame F and the wafer W whereby the tape extends over the frame F and the wafer W, and thus the wafer W is mounted to the frame F. Instead of this type of wafer mounting process, another wafer mounting process may be employed in which, for example, the tape T is applied to the back of the frame F in advance in the frame station 24, and the tape T is also applied to the back of the wafer W by positioning the wafer W within the opening 40 (the tape T is disposed in this opening 40) of the frame F in the mounting operation station 26.

Since the above-described in the illustrated embodiment do not constitute the novel features of the semiconductor wafer mounting and cutting system 2 constructed in accordance with this invention and are known among those skilled in the art, a detailed description thereof is omitted in this specification.

In the meantime, in the illustrated semiconductor wafer mounting and cutting system 2 constructed in accordance with this invention, a discriminating indication or indication means 44 has been applied in advance to the frame F loaded to the frame station 24 of the wafer mounting machine 4 as shown in FIG. 3 and FIG. 4. This discriminating indication or indication means 44 may be one showing a serial number (such as "67890") successively applied to the frame F to be used, for example a bar code applied to the surface of the frame F. As easily understood, the wafer W to be mounted to the frame F is not adversely affected by applying the indication means 44 to the frame F. Furthermore, the frame F has a large portion on which to apply the discriminating indication or indication means 44. Then, it is possible to apply to the frame F indication means 44 which can be very easily and accurately detected.

In the illustrated semiconductor wafer mounting and cutting system 2 constructed in accordance with this invention, a wafer detecting means 46 is provided in connection with the wafer station 22 of the wafer mounting machine 4. As is described in more detail hereinafter, this wafer detecting means 46 detects the indication or indication means 38 (FIG. 2) of the wafer W which is next to be fed to the mounting operation station 26 from among the wafers W existing in the wafer station 22. Wafer detecting means 46 forms; a wafer signal corresponding to the indication means 38 of the wafer W (accordingly corresponding to the characteristics of the wafer W) and supplies the controlling means 28 built in the wafer mounting machine 4 with this wafer signal. This wafer detecting means 46 may be a conventional optical detector.

In the illustrated semiconductor wafer mounting and cutting system 2 constructed in accordance with this invention, a frame detecting means 48 is also provided in connection with the junction 12. As is described in more detail hereinafter, this frame detecting means 48 detects the discriminating indication or indication means 44 applied to the frame F. Frame F and the wafer W mounted thereto conveyed to the junction 12 by the conveying means 10 whereupon frame detecting means 48 forms a frame signal corresponding to the discriminating indication or indication means 44 and supplies the controlling means 28 built in the wafer mounting machine 4 with this frame signal. In case the discriminating indication or indication means 44 is a bar code, this frame detecting means 48 may be a conventional optical bar code detector.

As described above, the wafer signal formed by the wafer detecting means 46 and the frame signal formed by the frame detecting means 48 are supplied to the controlling means 28 built in the wafer mounting machine 4, and on the basis of the wafer signal and the frame signal, the controlling means 28 forms a relative relation signal showing a relative relation between the frame indication means 44 of the frame F and the indication means 38 of the wafer W mounted to this frame F. Then, in the illustrated embodiment, the controlling means 28 functions not only as a controlling means for controlling the operation of the wafer mounting machine 4 but also as a relative relation signal forming means for relating the wafer signal supplied by the wafer detecting means 46 to the frame signal supplied by the frame detecting means 48 as required (namely, relating the wafer signal of a specific wafer W to the frame signal of the frame F to which this specific wafer W is mounted) and for forming the relative relation signal showing the relative relation of the both. The relative relation signal formed by the controlling means 28 is supplied to a memory means 50 built in the system controlling means 8 and memorized there. The memory means 50 may be a floppy disk. In this way, a relative relation list between the discriminating indication or indication means 44 of the frame F and the indication or indication means 38 of the wafer W, both of which are successively combined in the mounting operation station 26 of the wafer mounting machine 4, is memorized in the memory means 50.

The frame F and the wafer W mounted thereto conveyed from the wafer mounting machine 4 to the junction 12 by the conveying means 10 as described above are further conveyed into the wafer cutting machine 6A by the conveying means 14 or the wafer cutting machine 6B by the conveying means 16 according to the control of the system controlling means 8. Each of the wafer cutting machines 6A and 6B cuts the wafer W of the received frame F and wafer W mounted thereto along the straight-line areas 32 to separate it into the individual rectangular areas 34 (FIG. 2). However, the tape T is not cut, and therefore, although the wafer W is separated into the individual rectangular areas 34, the individual rectangular areas 34 are not separately scattered and are held by the tape T at the positions before the cutting. The wafer cutting machine 6A or 6B itself may be of a known type equipped with a cutting means (not shown) which may, for example, be a rotating diamond blade. Each of the illustrated wafer cutting machines 6A and 6B is also respectively provided with a controlling means 52A or 52B which may be constructed of a microprocessor, and the operations of the wafer cutting machine 6A or 6B itself are controlled by the controlling means 52A or 52B respectively. In the meantime, it is essential that the operations of the wafer cutting machine 6A or 6B are controlled according to the characteristics of the wafer W to be cut. For example, the difference in the characteristics of the wafer W includes the difference in the dimensions of the wafer W and/or the dimensions of the circuit pattern. Therefore, the relative positioning of the cutting means to the wafer W in the wafer cutting machine 6A or 6B should be appropriately carried out according to the characteristics of the wafer W. In the illustrated embodiment, as is described in more detail hereinafter, in addition to controlling the progression of the frame F and the wafer W mounted thereto from the junction 12 to the wafer cutting machine 6A or 6B, the system controlling means 8 obtains the information about the characteristics of the wafer W from the host computer 54 on the basis of the wafer signal formed by the wafer detecting means 46 and supplies the controlling means 52A or 52B of the wafer cutting machine 6A or 6B with this information. In this way, on the basis of the information about the characteristics of the wafer W supplied by the system controlling means 8, the controlling means 52A or 52B controls the operations of the wafer cutting machine 6A or 6B as required according to the characteristics of the wafer W to be cut. The construction and function of the wafer cutting machine 6A or 6B do not constitute the novel features of the semiconductor wafer mounting and cutting system 2 constructed in accordance with this invention. Various types of wafer cutting machines may be employed in the semiconductor wafer mounting and cutting system 2 constructed in accordance with this invention. Therefore, a detailed description of the wafer cutting machines 6A and 6B is omitted in this specification.

Figure 5:
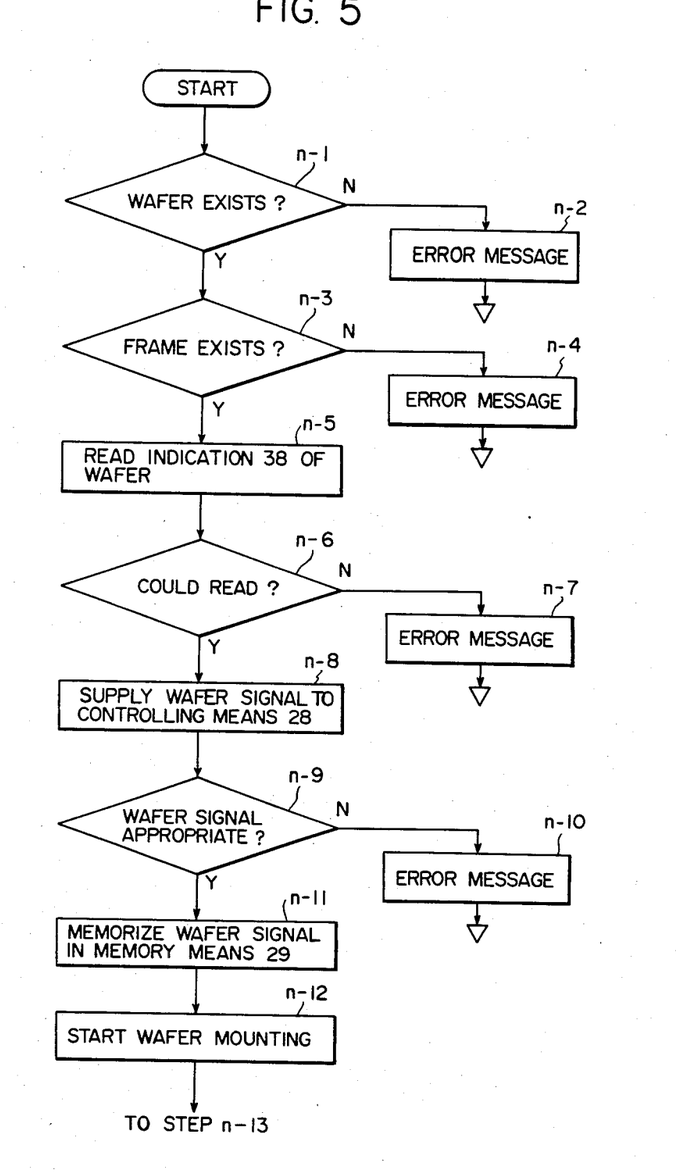
FIG. 5 is a flow chart showing one example of the operation sequence in the semiconductor mounting and cutting system illustrated in FIG. 1.

Next, with reference to FIG. 5 which is a flow chart showing a control sequence by the controlling means 28 and the system controlling means 8, the function of the controlling means 28 and the system controlling means 8 is described in detail.

It is determined in step n-1 whether the wafer W is present in the wafer station 22. This determination may be carried out on the basis of detecting of the wafer W by the wafer detecting means 46. If desired, a suitable wafer detector (not shown) such as a conventional optical detector including a light-emitting device and a photo detector may be disposed in the wafer station 22 and the aforesaid determination may be carried out on the basis of detection of the wafer W by this wafer detector. If no wafer W is in the wafer station 22, step n-2 sets in and an error message is supplied to the host computer 54 in this step n-2. When the wafer W is present in the wafer station 22 in step n-1, advance is made to step n-3. It is determined in step n-3 whether the frame F exists in the frame station 24. This determination may be carrier out on the basis of detection of the frame F by a frame detector (not shown) disposed in the frame station 24. The frame detector may be a conventional optical detector including a light-emitting device and a photo detector. If no frame F is present in the frame station 24, step n-4 begins and an error message is supplied to the host computer 54 in this step n-4. When the frame F is in the frame station 24 in steps n-3, advance is made to step n-5.

In step n-5, reading of the indication or indication means 38 (such as "12345") of the wafer W is carried out by the wafer detecting means 46. Then, it is determined in step n-6 whether the wafer detecting means 46 could read the indication or indication means 38 of the wafer W. If it could not read the indication 38 of the wafer W, step n-7 begins and an error message is supplied to the most computer 54 in this step n-7. When it is confirmed in step n-6 that the indication or indication means 38 of the wafer W could be read, step n-8 begins. In step n-8, the controlling means 28 is supplied with the wafer signal showing the indication or indication means 38 of the wafer W read by the wafer detecting means 46, for example, a binary digital signal showing "12345"). Then, step n-9 begins and it is determined whether the wafer signal supplied to the controlling means 28 is an appropriate one (i.e., is not illegal). If the wafer signal is not an appropriate one, in step n-10 an error message is supplied to the host computer 54. When it is confirmed in step n-9 that the wafer signal is an appropriate one, advance is made to step n-11. In step n-11, the wafer signal supplied to the controlling means 28 is memorized in a memory means 29 (this memory means 29 may be RAM) built in the controlling means 28.

Then, in step n-12 the wafer mounting operations are started. Specifically, one wafer W (i.e. the wafer W whose indication means 38 was read in step n-5) is fed from the wafer station 22 to the mounting operation station 26 and one frame F is fed from the frame station 24 to the mounting operation station 26 where the wafer W is mounted to the frame F by the tape T. Then, it is determined in step n-13 whether the wafer mounting has been completed (i.e. whether the wafer mounting machine 4 has carried out required wafer mounting operations). If the wafer mounting has not been completed, in step n-14 it is determined whether a predetermined time has passed since the wafer mounting operations were started. If the predetermined time has not passed, step n-13 is repeated. On the other hand, if the predetermined time has passed in step n-14, advance is made to step n-15. An error message is supplied to the host computer 54 and the wafer mounting operations are stopped in this step n-15.

When the wafer mounting has been completed in step n-13, step n-16 begins and the wafer mounting operations are stopped in this step n-16. Therefore, in step n-17, the conveying operations are started to convey the frame F and the wafer W mounted thereto from the wafer mounting machine 4 to the junction 12 by the conveying means 10. Then, it is determined in step n-18 whether the conveying operations have been completed. This determination may be carried out on the basis of detection of the frame F by the frame detecting means 48. If desired, a suitable detector (not shown) such as a conventional optical detector including a light-emitting device and a photo detector may be disposed at the junction 12 and the determination may be carried out on the basis of detection of the frame F, the wafer W or the tape T by this detector. If the conveying operations have not been completed, step n-19 begins and it is determined in this step n-19 whether a predetermined time has passed since the conveying operations were started. If the predetermined time has not passed, step n-18 is repeated. On the other hand, if the predetermined time has passed in step n-19, advance is made to step n-20. An error message is supplied to the host computer 54 and the conveying operations are stopped in this step n-20.

When the conveying operation have been completed in step n-18, step n-21 begins and the conveying operations are stopped in this step n-21. Thereafter, in step n-22, reading of the discriminating indication or indication means 44 (for example, a bar code showing a numeral 67890) of the frame F is carried out by the frame detecting means 48. Then, it is determined in step n-23 whether the frame detecting means 48 could read the discriminating indication or indication means 44 of the frame F. If it could not read the discriminating indication or indication means 44 of the frame F, sets in and an error message is supplied to the host computer 54 in this step n-24. When it is confirmed in stepn n-23 that the discriminating indication or indication means 44 of the frame F could be read, step n-25. In step n-25, the controlling means 28 is supplied with the frame signal showing the discriminating indication or indication means 44 of the frame F read by the frame detecting means 48, for example, a binary digital signal showing "67890". Then, step n-26 begins and it is determined whether the frame signal supplied to the controlling means 28 is an appropriate one (i.e. is not illegal). If the frame signal is not an appropriate one, in step n-27 an error message is supplied to the host computer 54. When it is confirmed in step n-26 that the frame signal is an appropriate one, advance is made to step n-28. In step n-28, the frame signal supplied to the controlling means 28 is memorized in the memory means 29 in connection with the wafer signal memorized in the memory means 29 in step n-11. Consequently, a relative relation signal such as a binary digital signal showing a relative relation between the discriminating indication or indication means 44 of the frame F and the indication or indication means 38 of the wafer W mounted to this frame F (for example, showing that "67890" in the frame F corresponding to "12345" in the wafer W) is memorized in the memory means 29. Thereafter, in step n-29, the relative relation signal memorized in the memory means 29 is transferred to the memory means 50 in the system controlling means 8 and memorized therein.

Subsequently, in step n-30, the states of the wafer cutting machines 6A and 6B are detected. This detection is carried out on the basis of the information supplied from the controlling means 52A and 52B, built in the wafer cutting machines 6A and 6B, to the system controlling means 8. Then, it is determined in step n-31 whether the wafer cutting machine 6A or 6B can receive the wafer W to be cut. If neither of the wafer cutting machines 6A and 6B can receive the wafer W to be cut, step n-30 is repeated. On the other hand, when in step n-31 at least either of the wafer cutting machines 6A and 6B, for example, the wafer cutting machine 6A can receive the wafer W to be cut, step n-32 begins. In step n-32, the feeding operations are started to feed the frame F and the wafer W mounted thereto from the junction 12 to the wafer cutting machine 6A by the conveying means 14. Then, in step n-33, on the basis of the wafer signal memorized in the memory means 50 which corresponds to the indication means 38 of the wafer W to be fed to the wafer cutting machine 6A, the information memorized in the host computer 54 is searched and necessary characteristics of the wafer W for the cutting of the wafer W are read out. In step n-34, a signal showing the read out characteristics of the wafer W is supplied to the controling means 52A of the wafer cutting machine 6A. It is determined in step n-35 whether the feeding operations have been completed. If the feeding operations have not been completed, step n-36 begins and it is determined in this step n-36 whether a predetermined time has passed since the feeding operations were started. If the predetermined time has not passed, step n-35 is repeated. On the other hand, if the predetermined time has passed in step n-36, step n-37 begins. An error message is supplied to the host computer 54 and the feeding operations are stopped in this step n-37.

When the feeding operations have been completed in step n-35, step n-38 begins and the feeding operations are stopped in this step n-38. Thereafter, in step n-39, the wafer cutting operations in the wafer cutting machine 6A are carried out. These wafer cutting operations themselves are controlled by the controlling means 52A built in the wafer cutting machine 6A. Then, it is determined in step n-40 whether an error was made in the wafer cutting operations. If an error was made, in step n-41 an error message is supplied to the host computer 54. On the other hand, when no error was made in in step n-40, step n-42 it is determined whether the wafer cutting operations have been completed. If the wafer cutting operations have not been completed, step n-39 is repeated. On the other hand, when the wafer cutting operations have been completed in step n-42, step n-43 begins. In this step n-43, the system controlling means 8 is supplied with the information showing that the wafer cutting machine 6A is prepared to receive the next wafer W to be cut.

As described hereinbefore, the frame F and the wafer W mounted thereto whose wafer W has been cut as required in the wafer cutting machine 6A or 6B are conveyed out of the wafer cutting machine 6A or 6B by the conveying means 18 or 20 respectively and fed into a processing means (not shown) for applying the next required treatment (for example, die bonding) to the wafer W. As easily understood, in the processing means as well, it is necessary to appropriately control the operations of the processing means according to the characteristics of the wafer W of the frame F and the wafer W mounted thereto. Nevertheless, as can be easily seen from FIG. 2, when the wafer W is cut along the straight-line areas 32 in the wafer cutting machine 6A or 6B, the indication area 36 of the wafer W is usually separated into a plurality of portions. Due to the above, after the wafer W has been cut as required, it is impossible or extremely difficult to detect the indication indication means 38 in the indication area 36 of the wafer W to recognize the characteristics of the wafer W.

In the illustrated semiconductor wafer mounting and cutting system 2 constructed in accordance with this invention, however, not only the discriminating indication or indication means 44 is applied to the frame F, which is never cut in the wafer cutting machine 6A or 6B, but also the relative relation list between the discriminating indication or indication means 44 of the frame F and the indication or indication means 38 of the wafer W (namely, the characteristics of the wafer W) mounted to this frame F is memorized in the memory means 50 of the system controlling means 8. Therefore, in the treatment at the aforesaid processing means after the cutting of the wafer W, it is possible to appropriately recognize the characteristics of the wafer W to be processed by detecting the discriminating indication or indication means 44 of the frame F, then searching the relative relation signals memorized in the memory means 50 and thereafter searching the information memorized in the host computer 54 on the basis of the former searching result. If desired, the relative relation signals memorized in the memory means 50 may also be transferred to the host computer 54.

While one embodiment of the wafer mounting and cutting system constructed in accordance with this invention has been described in detail hereinabove with reference to the accompanying drawings, it should be understood that the invention is not limited to this specific embodiment, and various changes and modifications are possible without departing from the scope of this invention.

For example, the indication or indication means 38 of the wafer W is detected in the wafer station 22 of the wafer mounting machine 4 by the wafer detecting means 46 in the above-described embodiment, but the indication or indication means 38 of the wafer W may be detected at any point before the wafer W is cut by the wafer cutting machine 6A or 6B, for example, at the point that the frame F and the wafer W mounted thereto are conveyed out of the wafer mounting machine 4 and reach the junction 12.

The discriminating indication or indication means 44 of the frame F is detected at the junction 12 by the frame detecting means 48 in the above-described embodiment, but the discriminating indication or indication means 44 of the frame F may be detected at any other suitable point, for example, at the frame station 24 of the wafer mounting machine 4 (accordingly, before the wafer W is mounted to the frame F).

Again in the above-described embodiment, the frame F having the discriminating indication or indication means 44 applied in advance is used and the relative relation between the discriminating indication or indication means 44 of the frame F and the characteristics of the wafer W mounted to the frame F is established by detecting the discriminating indication or indication means 44 of the frame F, but, if desired, when the relative relation between the frame indication means of the frame F and the indication 38 means of the wafer W mounted to the frame F is established (for example, when, before or after the wafer W is mounted to the frame F), the frame indication means can be applied to the frame F with a suitable discriminating indication or frame indication means applying machine.

Again in the above-described embodiment, the indication or indication means 38 of the wafer W is detected by the wafer detecting means 46, and on the basis of this the relative relation between the discriminating indication or indication means 44 of the frame F and the indication or indication means 38 of the wafer W mounted to the frame F is established. However, for example, where an operator has recognized the indication means 38 of the wafer W to be loaded to the wafer mounting machine 4 in advance, the operator can directly input the wafer signal corresponding to the indication means 38 of the wafer W to the controlling means 28 without detecting the indication means 38 of the wafer W, and thus the relative relation between the discriminating indication or indication means 44 of the frame F and the indication or indication means 38 of the wafer W mounted to the frame F may be established.

What is claimed is:

1. A semiconductor wafer mounting and cutting system including a wafer mounting machine for mounting a semiconductor wafer to a frame and a wafer cutting machine for receiving the frame and the wafer mounted thereto fed from said wafer mounting machine and cutting the wafer as required, said system comprising
controlling means for forming a relative relation signal showing a relative relation between a first indication means which has been or is applied to the frame and a second indication means of the wafer, which wafer has been or is mounted to the frame and
memory means for memorizing the relative relation signal formed by said controlling means.

2. The system of claim 1
which further comprises wafer detecting means for detecting said second indication means of the wafer to form a wafer signal corresponding to said second indication means before the wafer is cut by said wafer cutting machine.

3. The system of claim 1 wherein
said first indication means has been applied to the frame in advance,
the system further comprises frame detecting means for detecting said first indication means of the frame to form a frame signal corresponding to said first discriminating indication means.

4. The system of claim 3 wherein said first indication means of the frame is a bar code.

5. The system of claim 2 wherein
said wafer mounting machine includes a mounting operation station for mounting the wafer to the frame, a frame station for loading the frame to be supplied to said mounting operation station and a wafer station for loading the wafer to be supplied to said mounting operation station, and
said wafer detecting means detects said second indication means of the wafer when the wafer is in said wafer station.

6. The system of claim 2 wherein said wafer detecting means detects said second indication means of the wafer after the frame and the wafer mounted thereto are conveyed from said wafer mounting machine and before they are received by said wafer cutting machine.

7. The system of claim 3 wherein said frame detecting means detects said first indication means of the frame after the frame and the wafer mounted thereto are conveyed from said wafer mounting machine and before they are received by said wafer cutting machine.

8. The system of claim 3 wherein
said wafer mounting machine includes a mounting operation station for mounting the wafer to the frame, a frame station for loading the frame to be supplied to said mounting operation station and a wafer station for loading the wafer to be supplied to said mounting operation station, and
said frame detecting means detects said first indication means of the frame when the frame is in said frame station of said wafer mounting machine.

9. The system of claim 1 wherein
an opening having a larger area than the wafer is formed in the frame, and
said wafer mounting machine mounts the wafer to the frame by positioning the wafer within the opening and applying tape to the backs of the frame and the wafer extending over the frame and the wafer.

10. The system of claim 1 wherein
a circuit pattern applied to each of a plurality of rectangular areas defined by a plurality of straight-line areas arranged in a lattice pattern exists on the surface of the wafer, and
said wafer cutting machine cuts the wafer along the straight-line areas to separate the individual rectangular areas.

* * * * *